United States Patent
Chung et al.

(10) Patent No.: US 7,459,779 B2
(45) Date of Patent: Dec. 2, 2008

(54) PAD ARRANGEMENT OF DRIVER IC CHIP FOR LCD AND RELATED CIRCUIT PATTERN STRUCTURE OF TAB PACKAGE

(75) Inventors: Ye-Chung Chung, Gyeonggi-do (KR); Si-Hoon Lee, Gyeonggi-do (KR)

(73) Assignee: Samsung Electric Co., Ltd., Suwon-si, Gyeonggi-do (KR)

( * ) Notice: Subject to any disclaimer, the term of this patent is extended or adjusted under 35 U.S.C. 154(b) by 414 days.

(21) Appl. No.: 11/269,362

(22) Filed: Nov. 7, 2005

(65) Prior Publication Data

US 2006/0097286 A1    May 11, 2006

(30) Foreign Application Priority Data

Nov. 9, 2004    (KR)    .................. 10-2004-0090666

(51) Int. Cl.
*H01L 23/52* (2006.01)
*H01L 23/48* (2006.01)

(52) U.S. Cl. .............. 257/692; 257/E21.503; 257/203; 257/668; 257/696; 349/149; 349/152; 438/108

(58) Field of Classification Search .......... 257/E21.503, 257/E23.065, 734, 696, 692, 668, 203, E23.07; 349/149, 152; 438/108, 118; 174/250, 261
See application file for complete search history.

(56) References Cited

U.S. PATENT DOCUMENTS

| | | | |
|---|---|---|---|
| 5,341,233 A | | 8/1994 | Tomoike et al. |
| 6,037,654 A | * | 3/2000 | Tamura ................. 257/668 |
| 6,049,121 A | * | 4/2000 | Toyosawa et al. ......... 257/668 |
| 6,215,178 B1 | * | 4/2001 | Goto et al. ............. 257/668 |
| 6,525,718 B1 | * | 2/2003 | Murakami et al. ........ 345/206 |
| 6,534,855 B1 | * | 3/2003 | Ahn et al. .............. 257/698 |
| 6,603,527 B1 | | 8/2003 | Hayata et al. ........... 349/152 |
| 7,061,078 B2 | * | 6/2006 | Cheng ................... 257/666 |
| 7,087,987 B2 | * | 8/2006 | Chung et al. ............ 257/676 |
| 7,144,758 B2 | * | 12/2006 | Yuzawa ................. 438/108 |

(Continued)

FOREIGN PATENT DOCUMENTS

CN    1387633    12/2002

(Continued)

OTHER PUBLICATIONS

English language abstract of Korean Publication No. 2001-0109996.

(Continued)

*Primary Examiner*—Chris C. Chu
(74) *Attorney, Agent, or Firm*—Marger Johnson & McCollom, P.C.

(57) ABSTRACT

Output pads on an integrated circuit (IC) chip are arranged along a first longer side and are arranged along a second longer side with input pads. The output pads are connected to respective output patterns formed on top and bottom surfaces of a base film. All the output patterns may pass over the first longer side. Alternatively, the output patterns connected to the output pads at the second longer side may pass over a shorter side. These pattern structures establish an effective pad arrangement without increasing the size of a TAB package, yet allowing reduced the chip size.

15 Claims, 6 Drawing Sheets

U.S. PATENT DOCUMENTS

| | | | |
|---|---|---|---|
| 7,251,010 B2 * | 7/2007 | Miyasaka | 349/151 |
| 7,253,503 B1 * | 8/2007 | Fusaro et al. | 257/668 |
| 7,307,854 B2 * | 12/2007 | Itokawa | 361/784 |
| 7,335,977 B2 * | 2/2008 | Tsukiji | 257/690 |
| 2002/0018169 A1 * | 2/2002 | Kato | 349/149 |
| 2004/0108594 A1 * | 6/2004 | Toyosawa | 257/734 |

FOREIGN PATENT DOCUMENTS

| | | |
|---|---|---|
| JP | 03-025419 | 2/1991 |
| JP | 7-135236 | 5/1995 |
| JP | 2001-075493 | 3/2001 |
| KR | 92-13694 | 7/1992 |
| KR | 2001-0109996 | 12/2001 |
| KR | 2002-75951 | 10/2002 |
| WO | WO 02/21199 A1 | 3/2002 |

OTHER PUBLICATIONS

English language abstract of Korean Publication No. 2002-75951.
English language abstract of Japanese Publication No. 03-025419.
English language abstract of Japanese Publication No. 2001-075493.

* cited by examiner

PAD ARRANGEMENT OF DRIVER IC CHIP FOR LCD AND RELATED CIRCUIT PATTERN STRUCTURE OF TAB PACKAGE

CROSS REFERENCE TO RELATED APPLICATIONS

This U.S. non-provisional application claims priority under 35 U.S.C. §119 from Korean Patent Application No. 2004-90666, which was filed in the Korean Intellectual Property Office on Nov. 9, 2004, the contents of which are incorporated by reference herein in its entirety.

BACKGROUND OF THE INVENTION

1. Field of the Invention

The present invention relates generally to integrated circuit (IC) chip and package technology and, more particularly, to chip pad arrangements for a driver IC chip in a liquid crystal display (LCD) and a related circuit pattern structure of a tape automated bonding (TAB) package.

2. Description of the Related Art

Since the 1960's, LCDs have been used in calculators and digital watches. In recent years, LCDs represent remarkable progress in monitors for notebook computers and desktop computers. LCD technology will be likely applied to many products in a variety of fields.

In general, an LCD module is composed of an LCD panel having a liquid crystal suspension between two transparent panels, a backlight illuminating the LCD panel from beneath, and a driver unit applied to the LCD panel.

Figure 1:
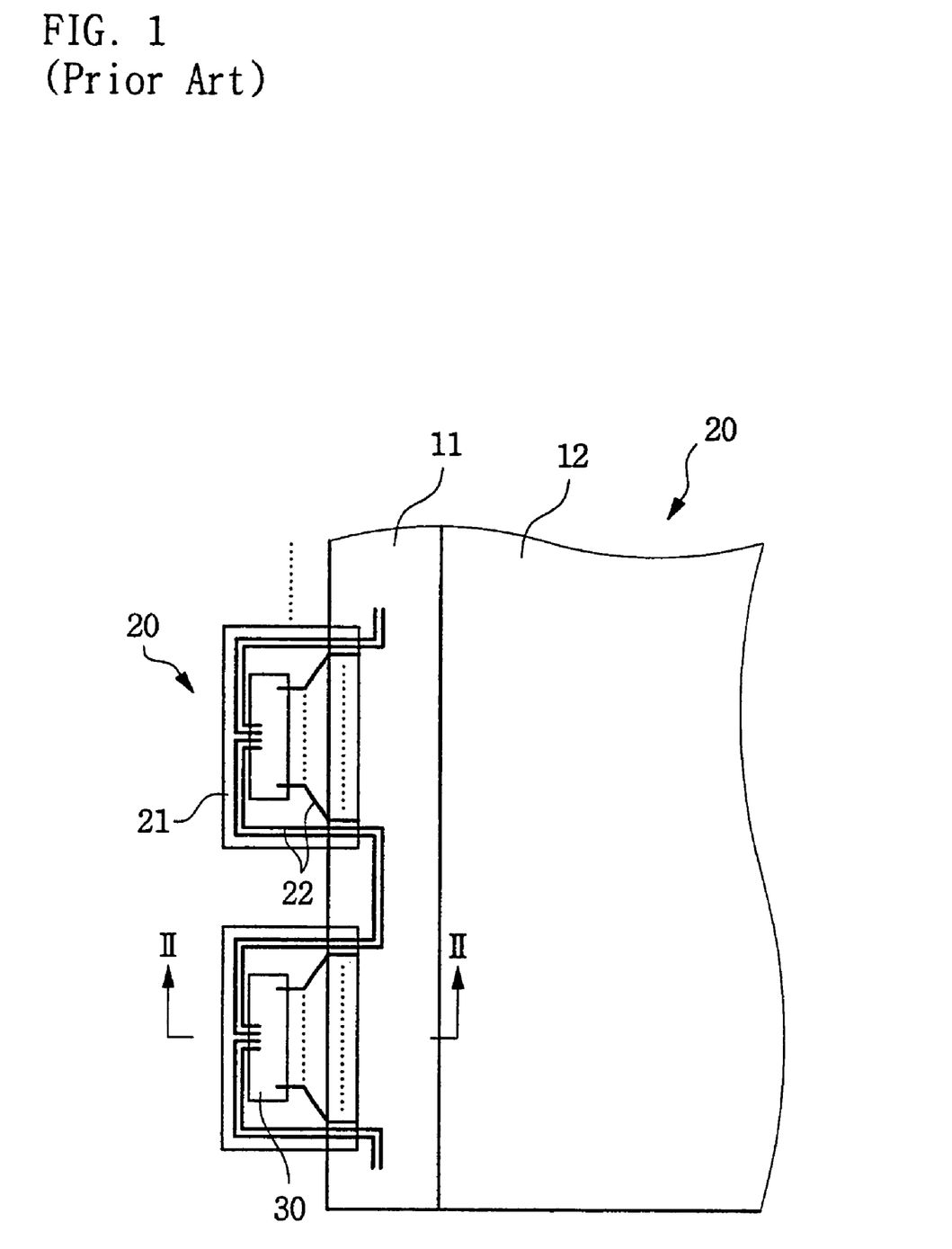
FIG. 1 (Prior Art) is a plan view showing a conventional LCD module.
Figure 2:
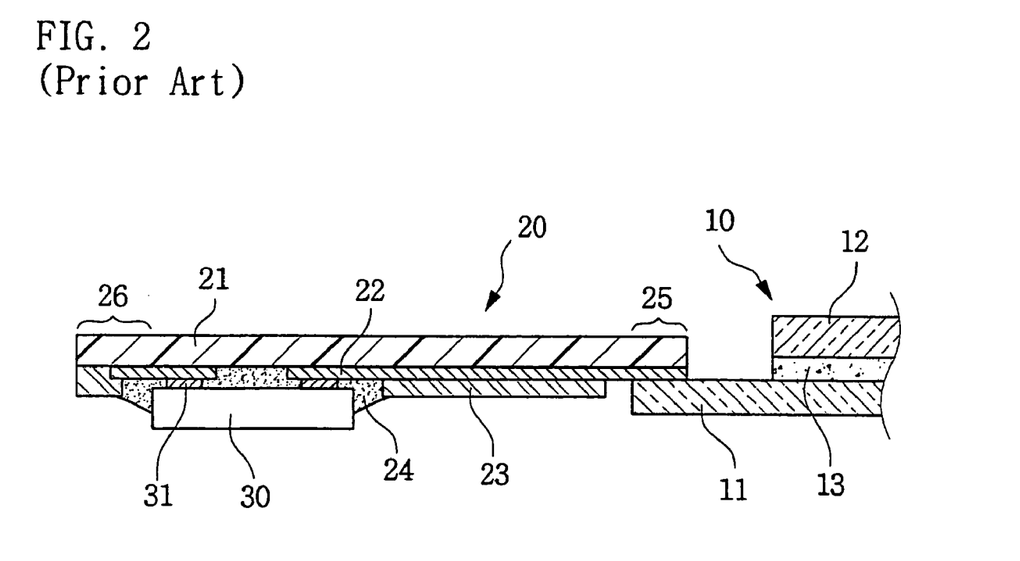
FIG. 2 (Prior Art) is a cross-sectional view taken along the line II-II in FIG. 1.

FIG. 1 shows, in a plan view, a conventional LCD module. FIG. 2 is a cross-sectional view taken along the line II-II in FIG. 1.

Referring to FIGS. 1 and 2, an LCD panel 10 has two glass substrates 11 and 12 and a liquid crystal layer 13 interposed between the glass substrates 11 and 12. On the glass substrates 11 and 12 are respectively provided thin film transistors (TFTs) and color filters. Subjecting the liquid crystal layer 13 to varying amounts of electrical charges, under the control the TFTs, crystals in the liquid crystal layer 13 change orientation to allow variation in the amount of light passing therethrough.

A driver unit 20, in the form of a TAB package, includes a base film 21 with circuit patterns 22 thereon. An IC chip 30 attaches to the circuit patterns 22 of the base film 21. The IC chip 30 is mechanically and electrically connected to the circuit patterns 22 through conductive bumps such as metal bumps 31 formed on input/output (I/O) pads of the IC chip 30. Most of the circuit patterns 22 are covered with a solder resist 23. Furthermore, a sealing resin 24, interposed between the IC chip 30 and the base film 21, protects the electrical connections. This type of TAB package 20 is known in the art as a chip-on-film (COF) package.

The TAB package 20 is connected to the TFTs of substrate 11 of the LCD panel 10 at a first peripheral region 25. In a typical LCD module, the TAB package 20 is further connected to a printed circuit board (PCB) at a second peripheral region 26. The PCB offers control signals and data signals necessary to driving the LCD panel 10. However, a recent advanced LCD module does not include the PCB, instead it transfers the functions of the PCB to both the IC chip 30 and the LCD panel 10. The above-discussed LCD module in FIGS. 1 and 2 is of the latter case, i.e., a TAB package without the PCB connections in the second peripheral region 26.

Figure 3:
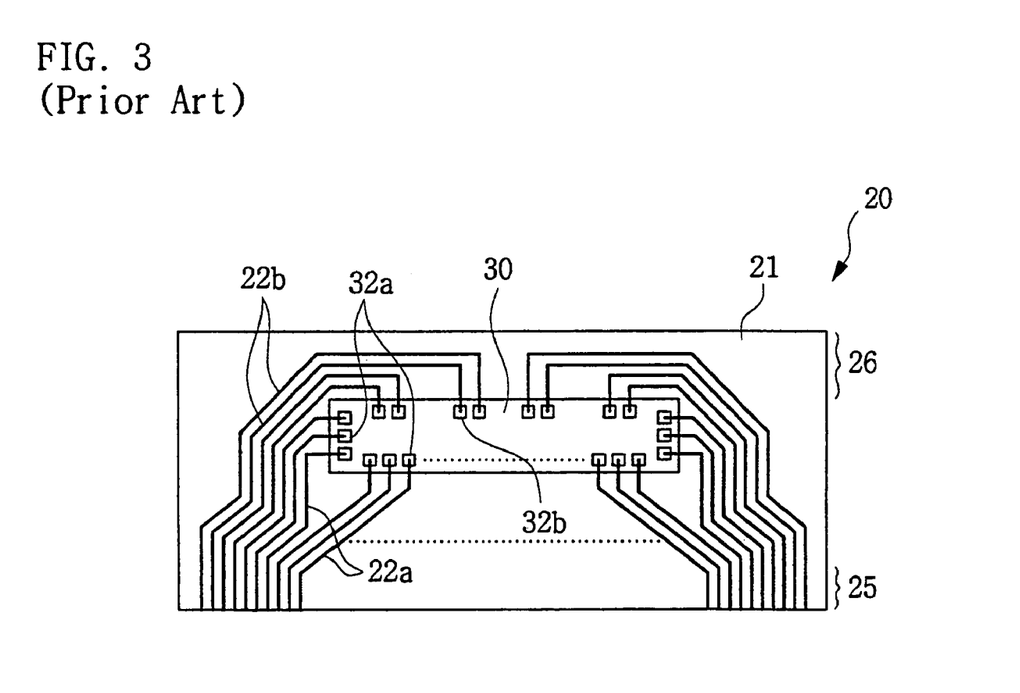
FIG. 3 (Prior Art) is a plan view showing a pad arrangement of an IC chip and circuit patterns of a TAB package shown in FIGS. 1 and 2.

FIG. 3 shows, in a plan view, a pad arrangement of the IC chip 30 and the circuit patterns 22 of the TAB package 20 shown in FIGS. 1 and 2.

Referring to FIG. 3, because of the absence of the PCB connections in peripheral region 26, both the output patterns 22a and the input patterns 22b are routed to the first peripheral region 25. However, since the input patterns 22b must pass though the second peripheral region 26, the relatively narrower second peripheral region 26 accommodates only a limited number of the patterns 22.

The IC chip 30, used as the LCD driver, has in general a much greater number of output pads 32a than input pads 32b.

If the second peripheral region 26 of the TAB package 20 increases in width, the output pads 32a may also be arranged along the upper longer side of the IC chip 30. However, the increase in width of the second peripheral region 26 may not only cause an unfavorable rise in production cost, but also lead to an increased size of the final LCD product. Accordingly, a new technique that arranges the output pads 32b to the upper longer side of the IC chip 30 without increasing the size of the TAB package 20 is desirable.

SUMMARY

Exemplary, non-limiting embodiments of the present invention provide a pad arrangement of an integrated circuit (IC) chip. Exemplary, non-limiting embodiments of the present invention further provide a circuit pattern structure of an IC package.

The IC chip according to one exemplary embodiment of the present invention comprises a first longer side, a second longer side, a pair of shorter sides, and a number of input/output (I/O) pads arranged thereon. The I/O pads include first output pads arranged along the first longer side, and second output pads arranged along the second longer side.

In the IC chip, the first output pads and the second output pads may be located at offset longitudinal positions along the respective longer sides. Furthermore, the number of the second output pads may be smaller than the number of the first output pads. The I/O pads may further include third output pads arranged along at least one of the shorter sides, and may further include input pads arranged along the second longer side.

The package according to another exemplary embodiment of the present invention comprises an IC chip and a base film. The IC chip includes a first longer side, a second longer side, a pair of shorter sides, and a plurality of I/O pads arranged thereon. The I/O pads have first output pads arranged along the first longer side, and second output pads arranged along the second longer side. The base film includes a top surface, a bottom surface opposing to the top surface, first output patterns formed on one of the top and bottom surfaces, and second output patterns formed on the other of the top and bottom surfaces. The first output patterns are electrically connected to the first output pads, and the second output patterns are electrically connected to the second output pads. Both the first and second output patterns pass over the first longer side.

In this package, the first output patterns may be formed on the bottom surface of the base film, and the second output patterns may be formed on the top surface of the base film. The IC chip may further include metal bumps formed on the respective first output pads. In this case, the first output patterns may be joined to the metal bumps on the first output pads, respectively.

Furthermore, the IC chip may further include metal bumps formed on the respective second output pads. In this case, each of the second output patterns may have a major part formed on the top surface of the base film, a minor part formed on the bottom surface of the base film, and a connection via formed within the base film and connecting the major part and the minor part. The minor parts of the second output patterns may be joined to the metal bumps on the second output pads, respectively.

Additionally, the first output pads and the second output pads may be located at different positions along the respective longer sides. The first output patterns and the second output patterns may pass through the first longer side by turns. The number of the second output pads may be smaller than the number of the first output pads.

Moreover, the I/O pads may further include third output pads arranged along at least one of the shorter sides. In this case, the base film may further include third output patterns electrically connected to the third output pads and crossing over at least one of the shorter sides. And, the I/O pads may further include input pads arranged along the second longer side. In this case, the base film may further include input patterns electrically connected to the input pads and crossing over the second longer side.

The package according to still another exemplary embodiment of the present invention comprises an IC chip and a base film. The IC chip includes a first longer side, a second longer side, a pair of shorter sides, and a number of I/O pads arranged thereon. The I/O pads have first output pads arranged along the first longer side, and second output pads arranged along the second longer side. The base film includes a top surface, a bottom surface opposing to the top surface, first output patterns formed on the bottom surface, and second output patterns formed on the bottom surface. The first output patterns are electrically connected to the first output pads, crossing over the first longer side. The second output patterns are electrically connected to the second output pads, crossing over at least one of the shorter sides.

In this package, the IC chip may further include metal bumps formed on the respective first and second output pads. The first and second output patterns may be joined to the metal bumps on the respective output pads. The number of the second output pads may be smaller than the number of the first output pads.

The I/O pads may further include input pads arranged along the second longer side. In this case, the base film may further include input patterns electrically connected to the input pads and crossing over the second longer side. The pitch of the second output patterns may be smaller than the pitch of the second output pads.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided to make this disclosure thorough and complete, and to convey aspects of the invention to those skilled in the art. The principles and features of this invention may be employed in varied and numerous embodiments beyond that shown herein without departing from the scope of the invention.

In is noted that some well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements. Like reference numerals are used for like and corresponding parts of the various drawings.

Figure 4:
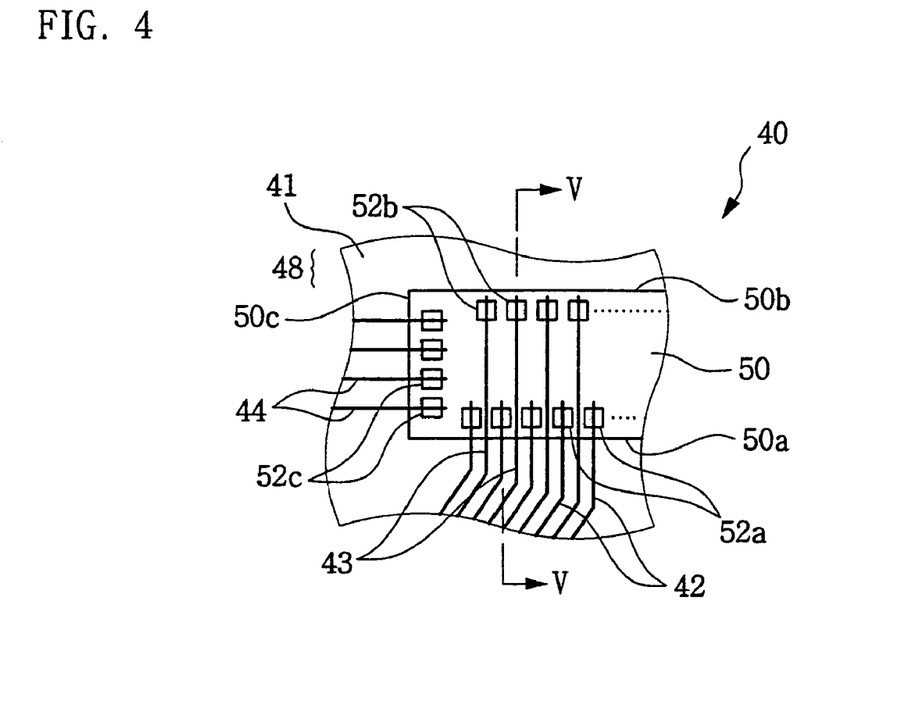
FIG. 4 is a partial plan view showing a pad arrangement of an IC chip and inner circuit patterns of a TAB package in accordance with one exemplary embodiment of the present invention.
Figure 5:
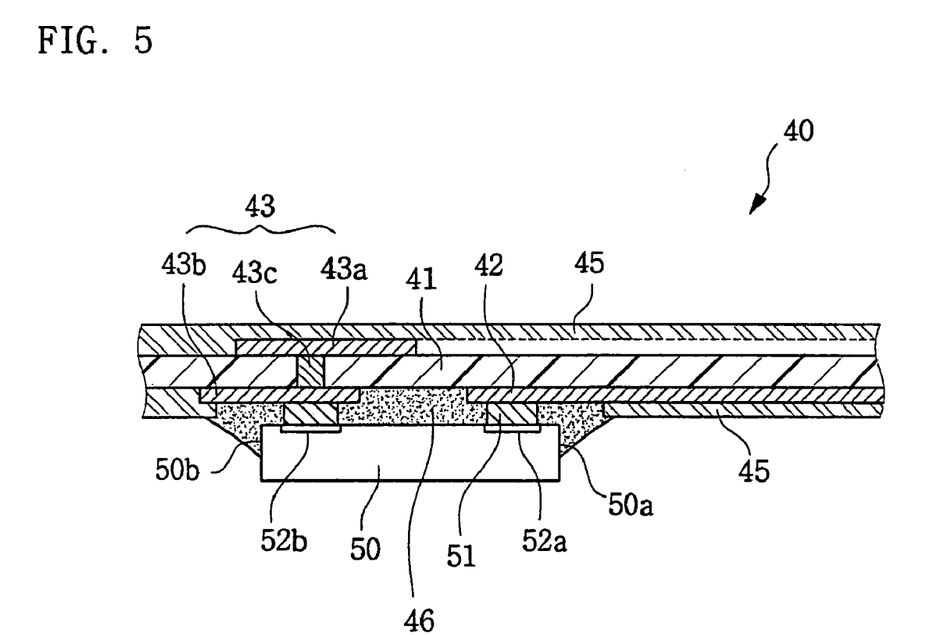
FIG. 5 is a cross-sectional view taken along the line V-V in FIG. 4.

FIG. 4 shows, in a partial plan view, a pad arrangement of an IC chip 50 and inner circuit patterns of a TAB package 40 in accordance with one exemplary embodiment of the present invention. FIG. 5 is a cross-sectional view taken along the line V-V in FIG. 4.

Referring to FIGS. 4 and 5, the IC chip 50 has a first longer side 50a, a second longer side 50b, and a pair of shorter sides 50c (only one of the sides 50c being shown in FIG. 4). The IC chip 50 may be an LCD driver chip such as, for example, a gate driver chip.

The IC chip 50 further has a great number of input/output (I/O) pads arranged thereon, including arrangements along the sides 50a, 50b and 50c. As discussed above, the IC chip 50 has, in general, a much greater number of output pads than input pads. For example, the number of the input pads can be about twenty, whereas the number of the output pads can reach about two hundred sixty. As will be appreciated, for purposes of illustration herein only a subset of the I/O pads are shown with it being understood that the illustrated methods of connection can be applied to other pads not necessarily shown herein.

In this embodiment, the output pads 52a, 52b and 52c of the IC chip 50 are arranged along four sides 50a, 50b and 50c. Hereinafter, the output pads 52a arranged along the first longer side 50a will be referenced as first output pads. Similarly, the output pads 52b and 52c are arranged along the second longer side 50b and along the shorter sides 50c, respectively, and will be referenced as second output pads and third output pads, respectively.

The first output pads 52a are arranged, for example, along the whole of the first longer side 50a. However, the second output pads 52b are arranged along portions of the second longer side 50b. The third output pads 52c are arranged along the whole or along portions of the shorter sides 50c. On the other hand, the input pads (not shown) are arranged along portions of the second longer side 50b, for example, along a central portion of side 50b. Since the second output pads 52b as well as the input pads are disposed along the second longer side 50b, the number of the second output pads 52b is smaller than the number of the first output pads 52a when disposed fully along the first longer side 50a.

Conductive bumps such as metal bumps 51 are formed on the output pads 52a, 52b and 52c and on the input pads. All the I/O pads may be made of aluminum (Al) or copper (Cu). The metal bumps 51 may be made of suitable metal such as gold (Au), copper (Cu) and solder. The metal bumps 51 mechanically and electrically connect the IC chip 50 to circuit patterns 42, 43 and 44 of a base film 41.

The base film 41 has a plurality of the circuit patterns 42, 43 and 44. The base film 41 may be made of flexible non-conductive material such as polyimide, and the circuit patterns 42, 43 and 44 may be made of copper (Cu). The circuit patterns have first output patterns 42 connected to the first output pads 52a, second output patterns 43 connected to the second output pads 52b, third output patterns 44 connected to the third output pads 52c, and input patterns (not shown) connected to the input pads.

As illustrated in FIG. 4, the first output patterns 42 and the second output patterns 43 are drawn out in the same direction from the corresponding output pads 52a and 52b, e.g., both crossing or passing over the first longer side 50a of the IC chip 50. On the other hand, the third output patterns 44 are drawn out in another direction from the corresponding pads 52c, e.g., crossing or passing over the adjacent shorter side 50c. Although not shown, the input patterns as well can be drawn out in the same direction as the first and second output patterns 42 and 43. The first output pads 52a and the second output pads 52b are located at different or interleaved relative positions along each longer side 50a and 50b. In other words, pads 52a lie along side 50a at given spacing and longitudinal position while pads 52b lie along side 50b at the same given spacing, but offset in longitudinal position. Therefore, with the first and second output patterns 42 and 43 extending in the same direction toward side 50a, patterns 42 and 43 pass in interleaved relation across the side 50a.

The base film 41 has a bottom surface facing the IC chip 50 and a top surface opposite the bottom surface. As illustrated in FIG. 5, the first output patterns 42 are formed on the bottom surface of the base film 41. The third output patterns and the input patterns as well are formed on the bottom surface. Each second output pattern 43 has a major part 43a, a minor part 43b, and a connection via 43c. The major parts 43a of the second output patterns 43 are formed on the top surface of the base film 41, but the minor parts 43b are formed on the bottom surface. The connection via 43c for each pattern 43 is selectively formed within or through the base film 41 and connects the major part 43a and the minor part 43b. Therefore, the first output patterns 42, the third output patterns 44 and the input patterns are directly joined to the corresponding metal bumps 51. The second output patterns 43, however, are indirectly joined to the corresponding metal bumps 51 by means of the corresponding minor part 43b and the corresponding connection via 43c.

Both surfaces of the base film 41 are mostly covered with a solder resist 45 for protecting the circuit patterns. Specifically, the top surface is wholly covered with the solder resist 45, whereas the bottom surface is partly covered with the solder resist 45, e.g., except at the chip-attachment portions. A sealing resin 46, for example epoxy, is formed in a space between the IC chip 50 and the base film 41 to protect electrical connections.

As discussed above, since the second output patterns 43 are located on the top surface of the base film 41, it becomes possible to draw out the second output patterns 43 in the same direction as the first output patterns 42 and across the first longer side 50a of chip 50. That is, although the second output pads 52b as well as the input pads are arranged along the second longer side 50b, the second output patterns 43 directly extend toward and across the first longer side 50a without passing through the second peripheral region 48.

By arranging the second output pads 52b along the second longer side 50b, the size of the IC chip 50 can be considerably reduced. For example, if this embodiment of the invention is applied to a conventional IC chip otherwise 16850 µm in width and 1000 µm in length, the width of the IC chip can be reduced to 9359 µm, thus achieving a decrease of 44.5%. Consider a conventional IC chip with two hundred sixty three of the output pads along the first longer side 50a and the shorter side 50c, and with twenty of the input pads along the second longer side 50b. In contrast, the described embodiment of the present invention shifts one hundred twenty of the output pads 52b to the second longer side 50b.

For electrical connections with the LCD panel, the second output patterns 43 formed on the top surface of the base film 41 can be connected again to the bottom surface near the first peripheral region. This is illustrated in FIGS. 6 and 7.

Figure 6:
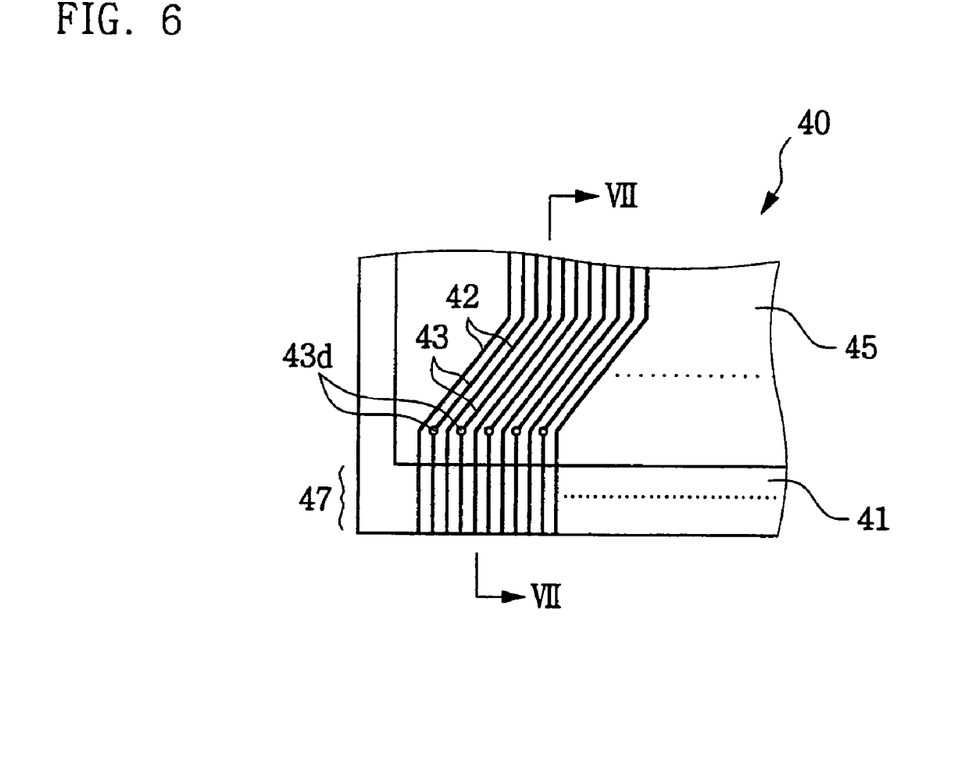
FIG. 6 is a partial plan view showing outer circuit patterns of the TAB package shown in FIGS. 4 and 5.

FIG. 6 shows, in a partial plan view, outer circuit patterns of the TAB package 40 shown in FIGS. 4 and 5. FIG. 7 is a cross-sectional view taken along the line VII-VII in FIG. 6.

Figure 7:
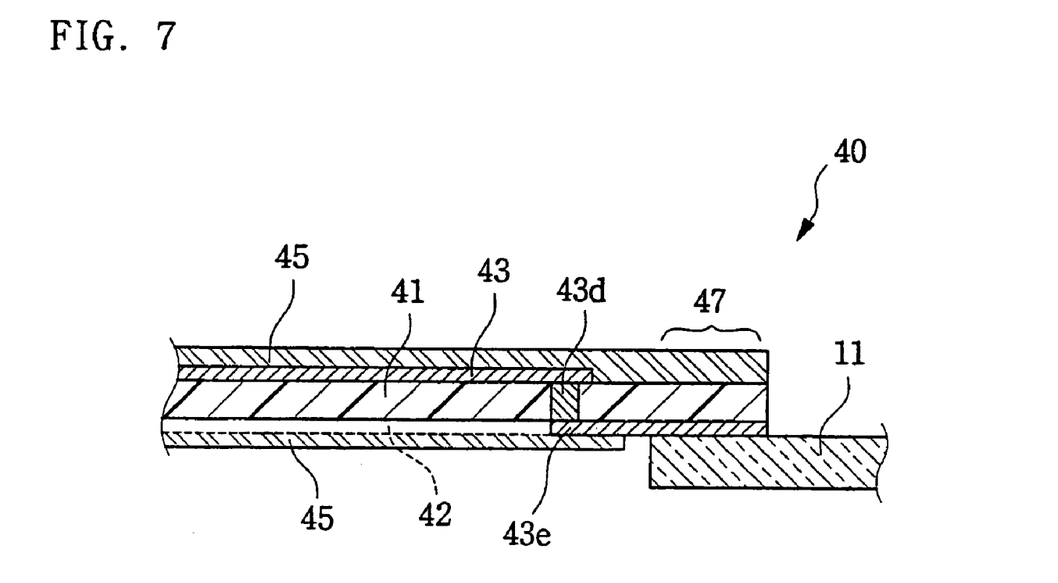
FIG. 7 is a cross-sectional view taken along the line VII-VII in FIG. 6.

Referring to FIGS. 6 and 7, the TAB package 40 is joined to the TFT substrate 11 of the LCD panel at the first peripheral region 47 of the base film 41. As shown in FIG. 6, the first and second output patterns 42 and 43 are drawn out in interleaved fashion and extend to the first peripheral region 47. Particularly, and as shown in FIG. 7, the major parts 43a of the second output patterns 43, i.e., those on the top surface of the base film 41, are connected to additional minor parts 43e, i.e., on the bottom surface of the base film 41, through second connection vias 43d. Therefore, the terminal portion of the second output patterns 43, i.e., at the first peripheral region 47, occupy the same plane as the first output patterns 42 and are thereby collectively joined to the TFT substrate 11.

Although not depicted in FIGS. 6 and 7, the third output patterns 44 and the input patterns are also drawn out on the bottom surface of the base film 41 and extend to the first peripheral region 47.

Figure 8:
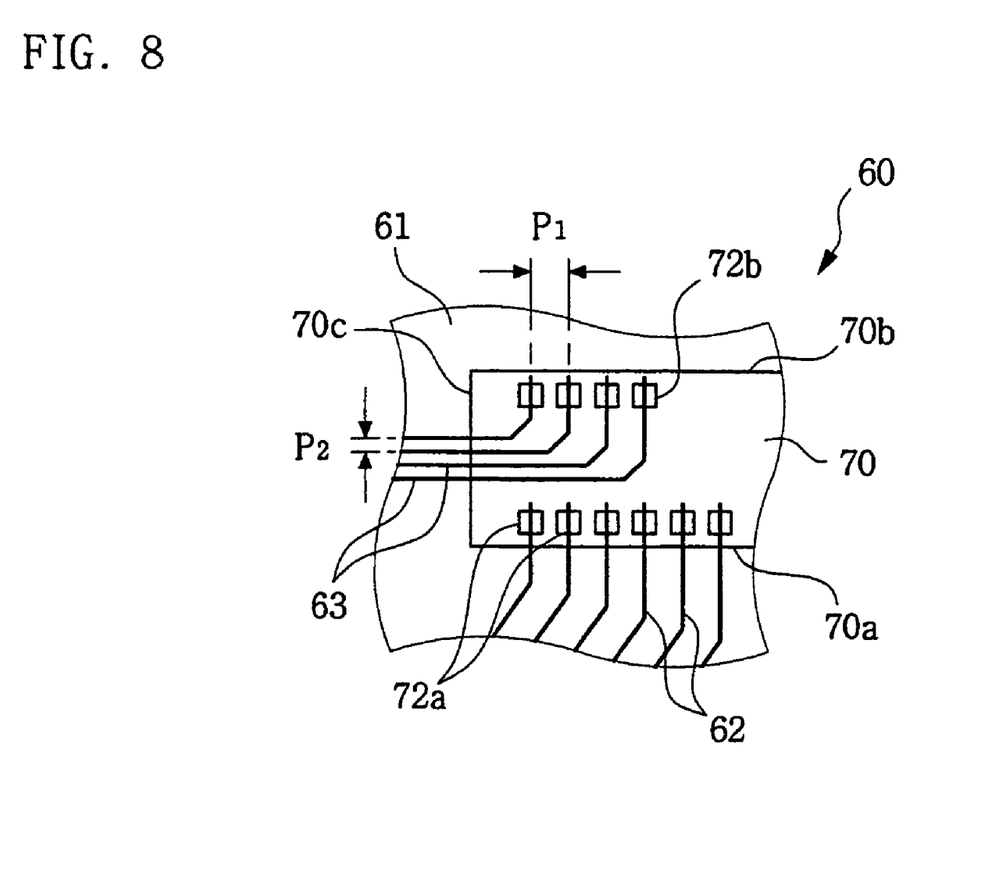
FIG. 8 is a plan view showing a pad arrangement of an IC chip and circuit patterns of a TAB package in accordance with another exemplary embodiment of the present invention.

The circuit patterns of the TAB package according to the present invention may be different in structure from those in the above-discussed embodiment. FIG. 8 shows, in a plan view, a pad arrangement of an IC chip 70 and circuit patterns of a TAB package 60 in accordance with another exemplary embodiment of the present invention.

Referring to FIG. 8, the IC chip 70 has a first longer side 70a, a second longer side 70b, and a pair of shorter sides 70c. The IC chip 70 further has a great number of I/O pads arranged thereon. In this embodiment, the output pads 72a and 72b are arranged along two longer sides 70a and 70b, respectively. Hereinafter, output pads 72a arranged along the first longer side 70a will be referred to as first output pads, and output pads 72b arranged along the second longer side 70b will be referred to as second output pads.

The first output pads 72a are arranged along the whole of the first longer side 70a, and the second output pads 72b are arranged along parts of the second longer side 70b. The input pads (not shown) are arranged along parts of the second longer side 70b. For example, the second output pads 72a are located near both ends of the second longer side 70b, and the input pads are located around the center of the second longer side 70b. The number of the first output pads 72a is greater than the number of the second output pads 72b. Metal bumps (not shown) are formed on the output pads 72a and 72b and the input pads, respectively.

The IC chip 70 is mechanically and electrically connected to circuit patterns 62 and 63 on a bottom surface of a base film 61 through the metal bumps. The circuit patterns have first output patterns 62 connected to the first output pads 72a, second output patterns 63 connected to the second output pads 72b, and input patterns (not shown) connected to the input pads.

The first output patterns 62 drawn out from the first output pads 72a cross over the first longer side 70a of the IC chip 70. On the other hand, the second output patterns 63 drawn out from the second output pads 72b cross over the adjacent shorter side 70c. Although not shown, the input patterns drawn out from the input pads cross over the second longer side 70b.

If the second output patterns 63 are drawn out through the shorter side 70c as illustrated, more output pads 72a can be disposed along the second longer side 70b than conventional output pads, e.g., pads 32a in FIG. 3, when disposed to the shorter side. In other words, the pitch (P2) of the second output patterns 63 is smaller than the pitch (P1) of the second output pads 72b and patterns 63 are made more dense than that of pads 72b.

Alternatively, if the same number of the output pads are disposed along the second longer side 70b instead of the shorter side 70c, the length of the shorter side 70c can be reduced.

Figure 9:
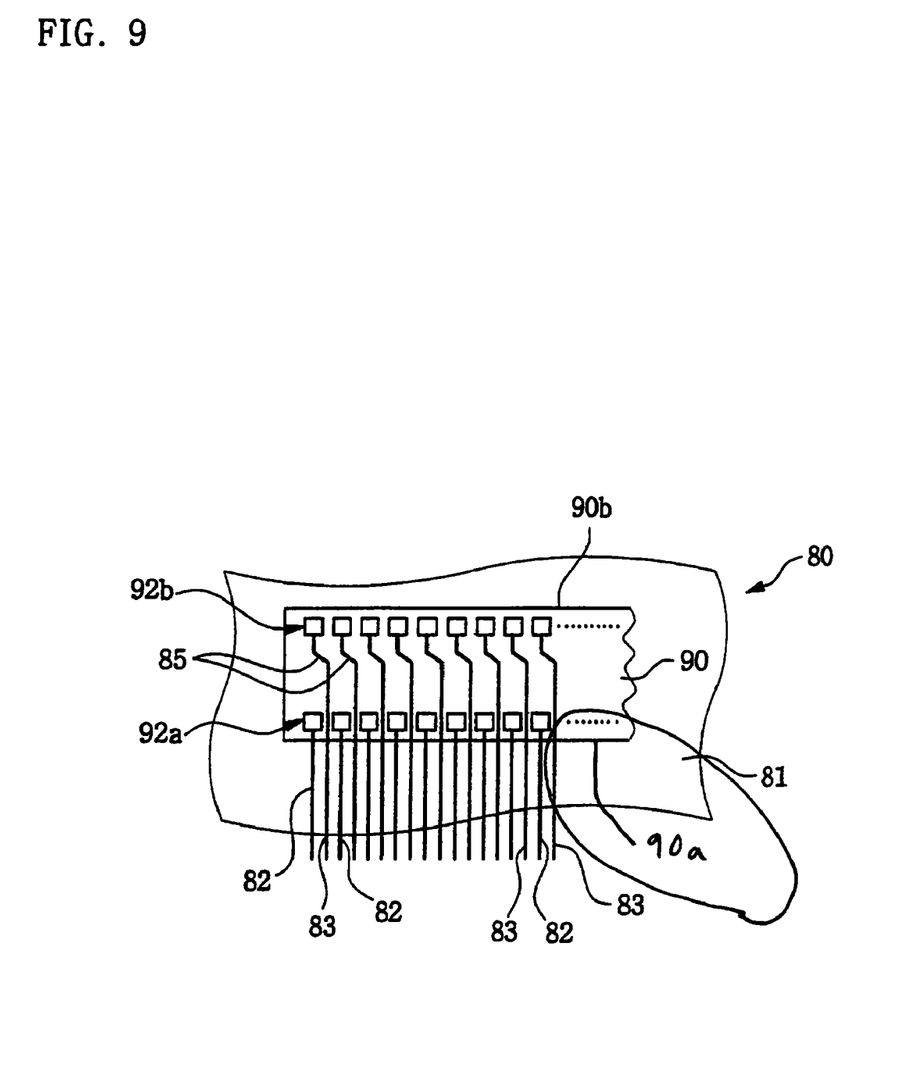
FIG. 9 is a plan view illustrating a further embodiment similar to that of FIGS. 4 and 5, but without longitudinally offsetting pad locations.

FIG. 9 illustrates a further embodiment similar to that of FIGS. 4 and 5, but without longitudinally offsetting pad locations. In FIG. 9, package 80 includes a film 81 bearing first circuit patterns 82 and second circuit patterns 83. Package 80 further includes an integrated circuit chip 90 having a first longer side 90a and a second longer side 90b. Output pads 92a are arranged along, for example, the whole of the first longer side 90a while output pads 92b are arranged along portions of the second longer side 90b. The bottom surface of film 81, i.e., facing chip 90, carries patterns 82 which couple by way of corresponding bumps (not shown) to pads 92a. In other words, circuit patterns 82 lie entirely on the bottom surface of film 81. Circuit patterns 83, however, are routed in a manner similar to patterns 43, i.e., with a major portion across the top surface of film 81, a first minor portion coupled directly to a corresponding bump, and a via coupling the first minor portion and the major portion through film 81.

Pads 92a and 92b occupy similar longitudinal locations along side 90a and side 90b, respectively. Major portions of patterns 83 include intermediate side 90a and side 90b and routing offsets 85 to locate each pattern 83 between a pair of patterns 82. In other words, routing offsets 85 allow patterns 82 and 83 to extend from chip 90 in a common direction, i.e., toward and over side 90a while passing over side 90a in interleaved fashion.

While not shown in FIG. 9, it will be understood that patterns 83 can be coupled back to the bottom surface of film 81 by way of a second via through film 81 and second minor portion on the bottom surface of film 81 for connection in a peripheral region adjacent a TFT substrate. In other words, in a manner similar to that of patterns 43.

The circuit patterns of the TAB package according to some embodiments of the present invention may have a mixed structure combining the above-discussed embodiments. Moreover, the TAB package according to the present invention may be usefully applied to the LCD module.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A package comprising:
    an integrated circuit chip including a first longer side, a second longer side opposite the first longer side, a pair of shorter sides, and a plurality of input/output pads arranged thereon, the input/output pads having first output pads arranged along the first longer side and second output pads arranged along the second longer side; and
    a base film including a top surface, a bottom surface opposite the top surface, first output patterns formed on one of the top and bottom surfaces, and second output patterns formed on the other of the top and bottom surfaces, the first output patterns being electrically connectable to the first output pads and the second output patterns being electrically connectable to the second output pads, the first and second output patterns being directed to pass over the first longer side.

2. The package of claim 1, wherein the first output patterns are formed on the bottom surface of the base film, and the second output patterns are formed on the top surface of the base film.

3. The package of claim 2, wherein the integrated circuit chip further includes conductive bumps formed on the respective first output pads.

4. The package of claim 3, wherein each of the first output patterns joins a corresponding one of the conductive bumps on the first output pads.

5. The package of claim 2, wherein the integrated circuit chip further includes conductive bumps formed on the respective second output pads.

6. The package of claim 5, wherein each of the second output patterns includes a major part formed on the top surface of the base film, a minor part formed on the bottom surface of the base film, and a connection via formed through the base film to connect the major part and the minor part.

7. The package of claim 6, wherein each of the minor parts of the second output patterns joins a corresponding one of the conductive bumps on the second output pads.

8. The package of claim 1, wherein the first output pads and the second output pads are located at offset longitudinal positions along the respective longer sides.

9. The package of claim 1, wherein the first output pads and the second output pads are located at corresponding longitudinal positions along the respective longer sides.

10. The package of claim 1, wherein the first output patterns and the second output patterns pass in interleaved relation over the first longer side.

11. The package of claim 1, wherein the number of the second output pads is smaller than the number of the first output pads.

12. The package of claim 1, wherein the input/output pads further include third output pads arranged along at least one of the shorter sides.

13. The package of claim 12, wherein the base film further includes third output patterns arranged to electrically connect to the third output pads and to pass over the at least one of the shorter sides.

14. The package of claim 1, wherein the input/output pads further include input pads arranged along the second longer side.

15. The package of claim 14, wherein the base film further includes input patterns arranged to electrically connect to the input pads and to pass over the second longer side.

* * * * *